(12) United States Patent
Seo et al.

(10) Patent No.: US 10,297,510 B1
(45) Date of Patent: May 21, 2019

(54) SIDEWALL IMAGE TRANSFER PROCESS FOR MULTIPLE GATE WIDTH PATTERNING

(71) Applicants: International Business Machines Corporation, Armonk, NY (US); GlobalFoundries, Inc., Georgetown, Grand Cayman (KY)

(72) Inventors: Soon-Cheon Seo, Glenmont, NY (US); Fee Li Lie, Albany, NY (US); Linus Jang, Portland, OR (US)

(73) Assignees: Internationel Business Machines Corporation, Armonk, NY (US); GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 15/962,536

(22) Filed: Apr. 25, 2018

(51) Int. Cl.
*H01L 21/8238* (2006.01)
*H01L 29/66* (2006.01)
*H01L 27/092* (2006.01)

(52) U.S. Cl.
CPC ......... *H01L 21/82385* (2013.01); *H01L 21/823821* (2013.01); *H01L 21/823864* (2013.01); *H01L 27/0924* (2013.01); *H01L 29/66545* (2013.01)

(58) Field of Classification Search
USPC ....................................................... 438/233
See application file for complete search history.

(56) References Cited

U.S. PATENT DOCUMENTS

| | | | |
|---|---|---|---|
| 7,960,287 B2 | 6/2011 | Johnson et al. | |
| 8,099,686 B2 | 1/2012 | Schultz | |
| 8,450,833 B2 | 5/2013 | Kim | |
| 8,673,165 B2 | 3/2014 | Raghunathan et al. | |
| 8,951,868 B1 | 2/2015 | Jain | |
| 9,107,291 B2 * | 8/2015 | Cheng | G03F 7/0002 |
| 9,252,243 B2 | 2/2016 | He et al. | |
| 9,293,551 B2 | 3/2016 | Fan et al. | |
| 9,305,845 B2 | 4/2016 | Colburn et al. | |
| 9,417,528 B2 * | 8/2016 | Shirakawa | G03F 7/11 |
| 9,437,502 B1 * | 9/2016 | Cheng | H01L 21/823842 |
| 9,564,369 B1 * | 2/2017 | Kim | H01L 21/823431 |
| 9,923,080 B1 * | 3/2018 | Greene | H01L 29/66545 |
| 10,037,989 B1 * | 7/2018 | Cheng | H01L 29/735 |
| 2002/0172896 A1 * | 11/2002 | Adams | G03F 7/091 |
| | | | 430/322 |

(Continued)

*Primary Examiner* — Caleb E Henry
(74) *Attorney, Agent, or Firm* — Jeffrey S LaBaw; Steven J Meyers

(57) ABSTRACT

A method for fabricating a multiple gate width structure for an integrated circuit is described. A fin on a semiconductor substrate with a first hard mask layer is covered by a first and second sacrificial gate each of which includes a second hard mask layer. Spacer layers and a dielectric layer are formed over the first and second sacrificial gate structures. The resulting structure is planarized so that the first and second sacrificial gate structures and the dielectric layer have coplanar top surfaces. The first and second sacrificial gate structures are removed to respectively form first and second trench recesses in the dielectric layer. The trench recesses are filled with a conductor to form permanent gate structures. A first permanent gate structure is formed in the first trench recess has a first length and a second permanent gate structure is formed in the second trench recess has a second length greater than the first length.

14 Claims, 16 Drawing Sheets

(56) References Cited

U.S. PATENT DOCUMENTS

| | | | | |
|---|---|---|---|---|
| 2005/0191865 A1* | 9/2005 | Jacobson | | C23C 8/10 |
| | | | | 438/780 |
| 2007/0274357 A1* | 11/2007 | Bazan | | C08G 61/02 |
| | | | | 372/43.01 |
| 2008/0073754 A1* | 3/2008 | Zampini | | G03F 7/091 |
| | | | | 257/642 |
| 2011/0193172 A1* | 8/2011 | Juengling | | H01L 27/10802 |
| | | | | 257/368 |
| 2011/0220994 A1* | 9/2011 | Parekh | | H01L 27/10882 |
| | | | | 257/334 |
| 2012/0088188 A1* | 4/2012 | Trefonas | | B81C 1/00031 |
| | | | | 430/270.1 |
| 2014/0183661 A1* | 7/2014 | Lin | | H01L 21/823431 |
| | | | | 257/401 |
| 2014/0256093 A1* | 9/2014 | Lin | | H01L 21/823431 |
| | | | | 438/157 |
| 2014/0264345 A1* | 9/2014 | Tsai | | H01L 21/2022 |
| | | | | 257/52 |
| 2014/0273446 A1* | 9/2014 | Huang | | H01L 21/76816 |
| | | | | 438/669 |
| 2014/0273457 A1* | 9/2014 | Su | | G03F 7/40 |
| | | | | 438/692 |
| 2014/0273506 A1* | 9/2014 | Liu | | C09D 5/006 |
| | | | | 438/758 |
| 2014/0342292 A1* | 11/2014 | Fu | | C09D 183/04 |
| | | | | 430/325 |
| 2015/0031207 A1 | 1/2015 | Bencher et al. | | |
| 2015/0031217 A1* | 1/2015 | Naasani | | B82Y 30/00 |
| | | | | 438/780 |
| 2015/0037946 A1* | 2/2015 | Fumitake | | H01L 29/808 |
| | | | | 438/231 |
| 2015/0111384 A1* | 4/2015 | Chang | | C08F 220/18 |
| | | | | 438/694 |
| 2015/0145083 A1* | 5/2015 | Chou | | H01L 27/14645 |
| | | | | 257/432 |
| 2015/0195916 A1* | 7/2015 | Cheng | | G03F 7/0002 |
| | | | | 216/47 |
| 2015/0286771 A1* | 10/2015 | Choi | | G06F 17/5081 |
| | | | | 716/51 |
| 2015/0325575 A1* | 11/2015 | Park | | H01L 29/0653 |
| | | | | 257/401 |
| 2015/0349076 A1 | 12/2015 | Chudzik et al. | | |
| 2015/0357440 A1* | 12/2015 | Cheng | | H01L 29/66795 |
| | | | | 257/401 |
| 2015/0380489 A1* | 12/2015 | Chan | | H01L 27/0886 |
| | | | | 257/192 |
| 2016/0005595 A1* | 1/2016 | Liu | | H01L 21/0276 |
| | | | | 438/703 |
| 2016/0005735 A1* | 1/2016 | Costrini | | H01L 27/0886 |
| | | | | 257/401 |
| 2016/0013041 A1* | 1/2016 | Liu | | H01L 21/0212 |
| | | | | 438/703 |
| 2016/0118480 A1* | 4/2016 | Xie | | H01L 29/66795 |
| | | | | 257/347 |
| 2016/0163863 A1* | 6/2016 | Jacob | | H01L 29/7851 |
| | | | | 257/401 |

* cited by examiner

A-A

SIDEWALL IMAGE TRANSFER PROCESS FOR MULTIPLE GATE WIDTH PATTERNING

BACKGROUND OF THE INVENTION

This disclosure relates to integrated circuit devices, and more specifically, to an advanced method and structure to create multiple gate width patterning in semiconductor devices.

As the dimensions of modern integrated circuitry in semiconductor chips continues to become smaller, conventional lithography is increasingly challenged to make smaller and smaller structures. Sidewall Image Transfer (SIT) patterning for forming a gate structure is frequently used for gate pitches below 64 nm. However, multiple gate width patterning at such small pitches becomes complicated at hard mask assembly. It often requires complicated, multiple mask layers and complex patterning schemes. Further, the prior art process is susceptible to pitch walk for the gate structures without careful process control.

The present disclosure presents an advanced sidewall image transfer process for multiple gate width patterning to alleviate this problem.

BRIEF SUMMARY

According to this disclosure, a method for fabricating a multiple gate width structure for an integrated circuit is described. A fin on a semiconductor substrate with a first hard mask layer is covered by a first and second sacrificial gate each of which includes a second hard mask layer. Spacer layers and a dielectric layer are formed over the first and second sacrificial gate structures. The resulting structure is planarized so that the first and second sacrificial gate structures and the dielectric layer have coplanar top surfaces. The first and second sacrificial gate structures are removed to respectively form first and second trench recesses in the dielectric layer. The trench recesses are filled with a conductor to form permanent gate structures. A first permanent gate structure is formed in the first trench recess has a first length and a second permanent gate structure is formed in the second trench recess has a second length greater than the first length.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
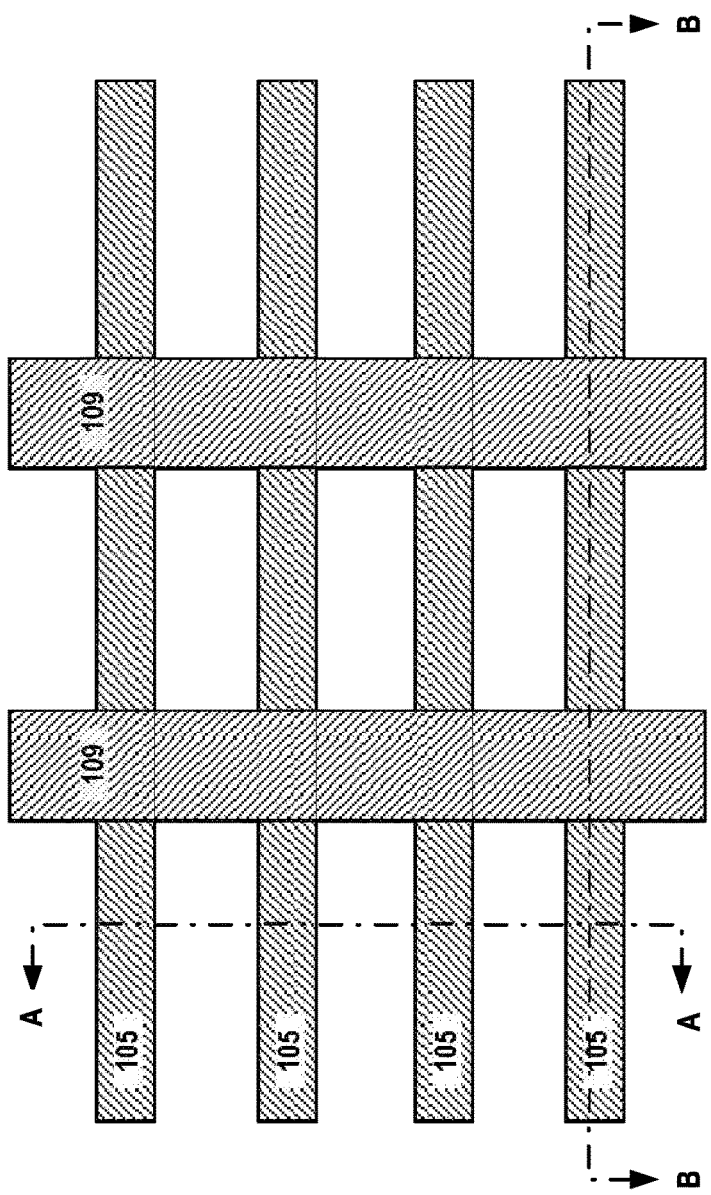
FIG. 1 is a diagram depicting a set of gates and a set of fins to orient the remaining drawings depicting a first embodiment of the invention.

At a high level, the invention provides a method and resulting structure to practice a Sidewall Image Transfer (SIT) patterning process for forming multi-gate length structures. As compared to a conventional process, the inventive multiple gate length process is performed after a gate stack etch with an extra spacer liner which will be consumed during a replacement metal gate (RMG) gate pull process. According to the invention, sidewall spacers are selectively formed used around some of the set of sacrificial gates. A sacrificial SiGe layer is employed as a protective layer to protect the device layer.

While there have been prior methods to fabricate multi-gate length structure, the present invention has advantages over prior art schemes. Multi-gate length structures, i.e. having at least one nominal length gate length and a second gate length other than the nominal gate length are so-called WIMPY structures. Many of the structure use SIT for patterning. In the prior art, mandrels are formed over the gate material and sidewall material is deposited over the mandrels. The mandrels which will form wimpy gates, i.e., the ones which will be longer, are masked while the mandrels which will form the nominal gates are etched. The critical dimension (CD) control is at the mask open level which causes pitch walk for a WIMPY device unless the mandrel CD is adjusted. Furthermore, the prior art has a complicated mask assembly.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings. The various layers in the structures below are deposited and removed using well known processes. Examples of processes that can be used to perform the steps of the invention, but should not be viewed as limiting.

Figure 2:
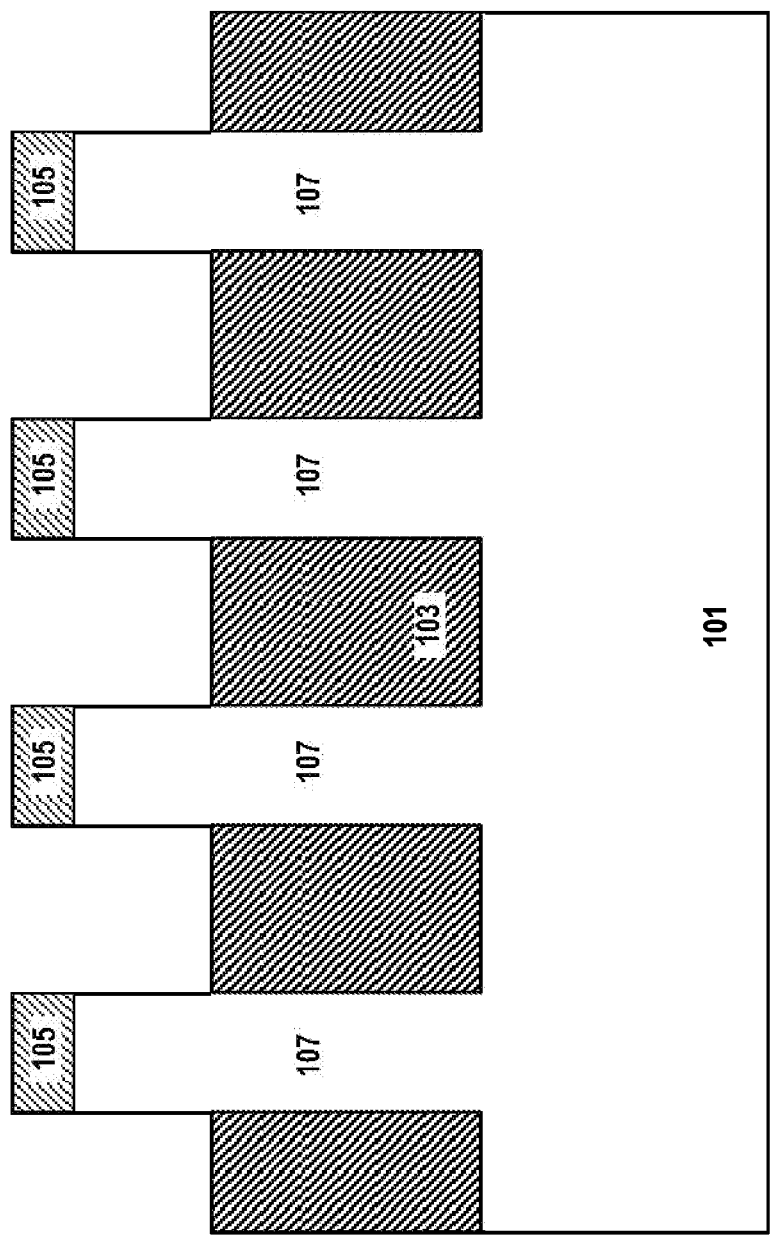
FIG. 2 is a cross-sectional diagram depicting the structure through a set of fins having a top sacrificial SiGe layer according to a first embodiment of the invention.

FIG. 1 is a diagram depicting a set of gates and a set of fins to orient the remaining drawings depicting a first embodiment of the invention. A set of fins on which a hard mask 105 is formed are deposed on a substrate. Typically, the substrate is silicon or another semiconductor. A set of sacrificial gate patterns are formed over and orthogonally to the set of fins. Another hard mask 109 is formed over the sacrificial gate patterns. Typically, the hard mask 105 over the fins is a different material than the hard mask 109 over the sacrificial gate patterns with different etch characteristics so that process can be controlled. FIG. 2 shows the cross-sectional view along line AA. The remainder of the drawings show the cross-sectional view along line BB.

FIG. 2 is a cross-sectional diagram depicting the structure through a set of fins having a top sacrificial SiGe layer according to a first embodiment of the invention. The figure shows a cross-section of a semiconductor substrate 101, e.g., silicon, across a set of fins 107 which extend perpendicularly from the substrate 101 separated by shallow trench isolation (STI) oxide 103. The fins 107 are etched from the substrate 101 using a top sacrificial layer hard mask layer 105 made of a first hard mask material, e.g., a high K dielectric (HiK) or SiGe. Active semiconductor source drain fins 107 measure 60-200 nm, preferably 60-100 nm, in height in different embodiments of the invention. In alternative embodiments, the active fins 107 could be nano wire stacks.

Figure 3:
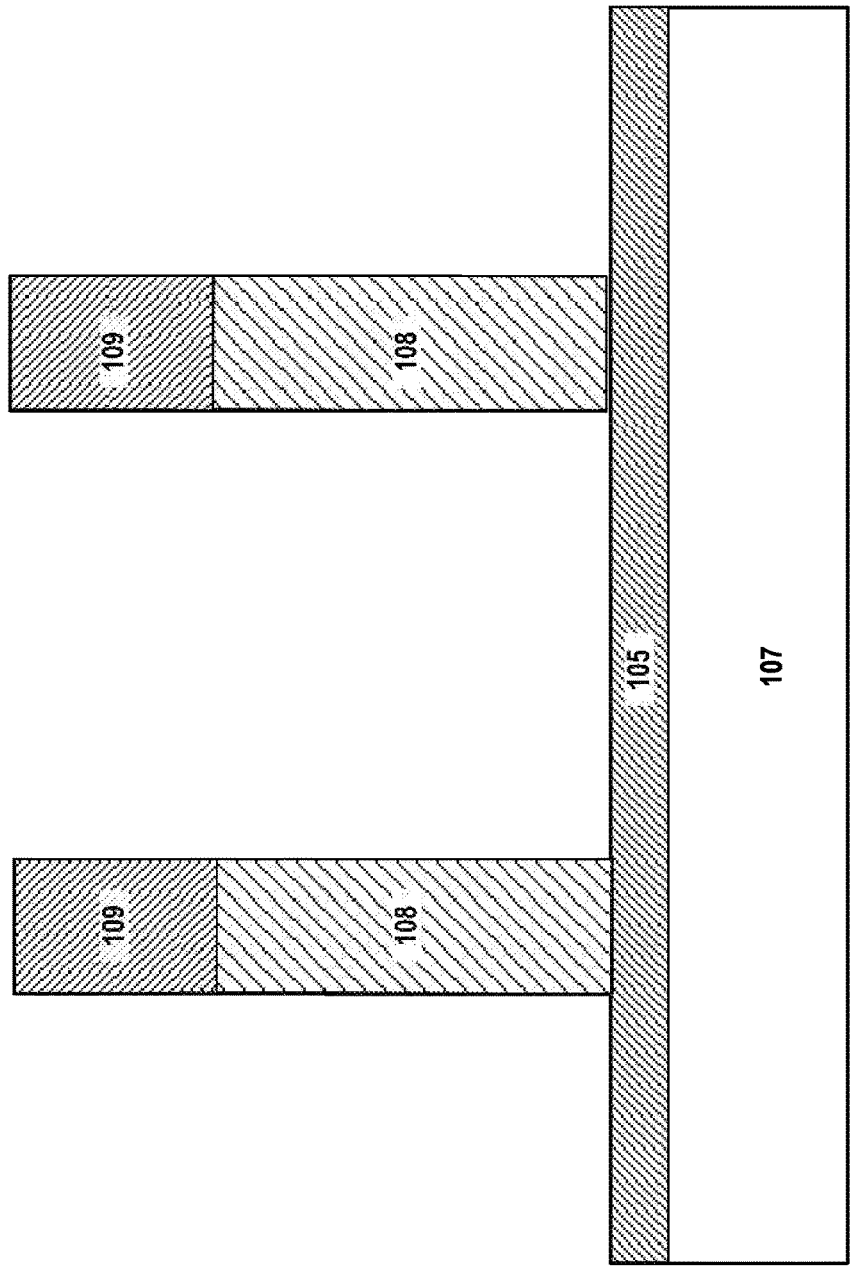
FIG. 3 is a cross-sectional diagram depicting the structure along a single fin depicting a cross-section of a set of sacrificial gate patterns according to a first embodiment of the invention.

FIG. 3 is a cross-sectional diagram depicting the structure for creating a set of sacrificial gates 108 over a set of fins 107 according to a first embodiment of the invention. As compared to FIG. 2, the cross-sectional view BB is across one of the fins 107 and parallel to the length of the fin. The remainder of the drawings are provided along the BB view. The fin 107 has been patterned with the top sacrificial hard mask layer 105. Although not shown in FIG. 3, in preferred embodiments of the invention, there is a thin dielectric layer between layers 108 and 105 which is used as an etch stop for an gate etch process. In such embodiments, it is typically a sacrificial oxide layer which includes, but is not limited to SiO2, SiO2 with nitrogen or HfO2. A sacrificial gate 108 is made of a material with different etch characteristics than the hard mask 105, e.g., the gates 108 are made of amorphous silicon (Si) or another type of suitable material. The gate hard mask 109 is used to pattern the sacrificial gate 108 from a blanket layer of the sacrificial gate material deposited for example by a chemical vapor deposition process. In embodiments of the invention, the gate hard mask 109 is 20-100 nm in thickness; the sacrificial gate material is 50-150 nm in height for a gate pitch of 60-100 nm. The sacrificial gates 108 and hard mask 109 will have widths from 10 to 30 nm in some embodiments, but other widths are used in other embodiments. The gate hard mask material 109 was covered with OPL (optical planarization layer, not shown in this figure) which should preferably have different etch characteristics than the sacrificial gate 108 and the thin sacrificial dielectric layer above 105 (not shown in the figure) used for patterning the fins or the sacrificial gate material. After forming gates over fins without a damage into hard mask 105, this OPL is removed by a wet or dry etch process. In the first embodiment, the gate hard mask 109 may be made of SiN, SiN/SiO2, SiBCN or SiOCN, in either a single or multi-layer mask or any combination thereof to enable gate patterning.

Figure 4:
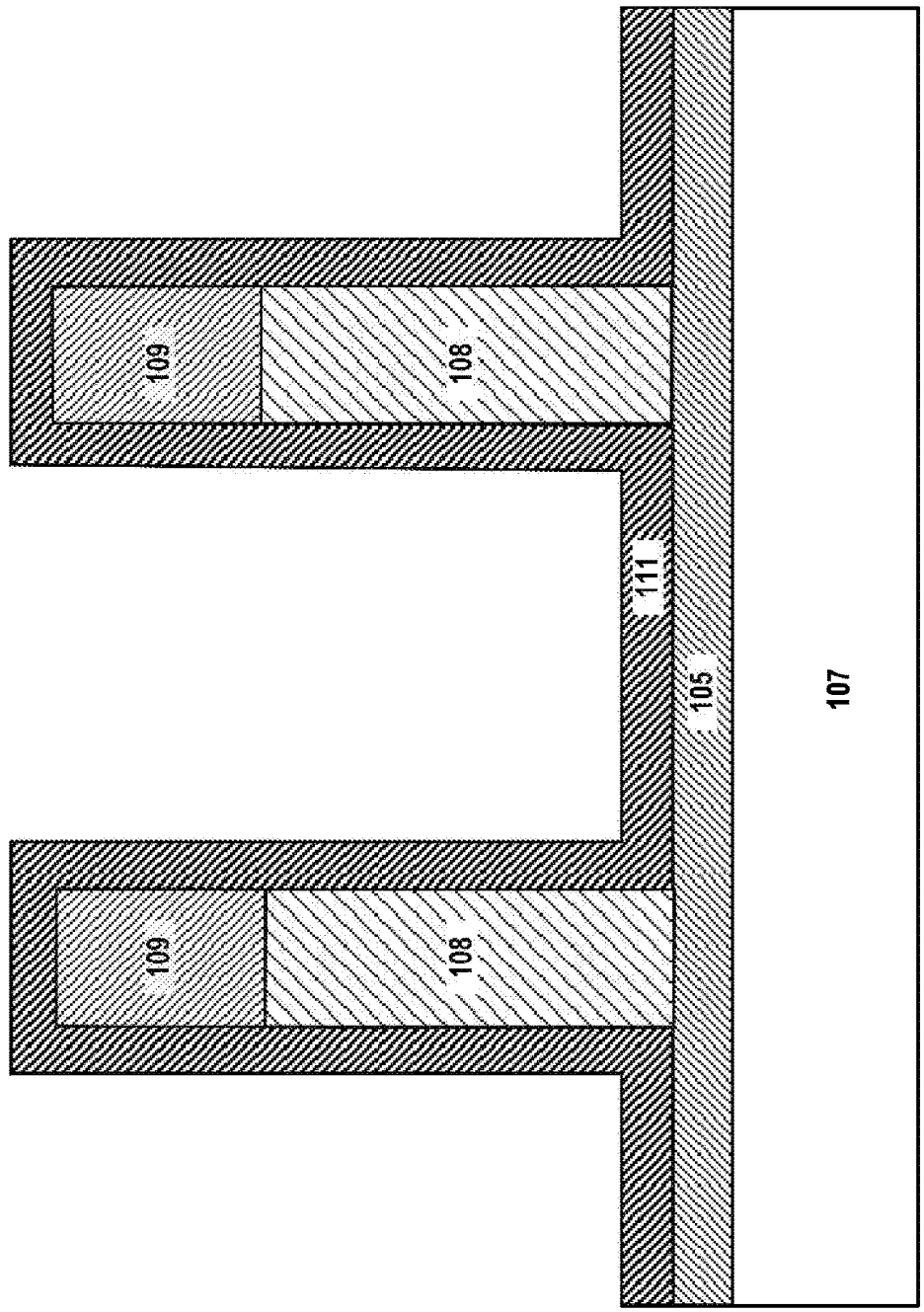
FIG. 4 is a cross-sectional diagram depicting the structure along a single fin depicting a cross-section of a set of sacrificial gate patterns after an oxide deposition step according to a first embodiment of the invention.

FIG. 4 is a cross-sectional diagram depicting the structure of the sacrificial gate patterns after an oxide deposition step according to a first embodiment of the invention. The oxide deposition step leaves a conformal layer 111 of oxide over the hard mask 105, gate hard mask 109 and sacrificial gate 108. In alternative embodiments, oxide-nitride layers or another material can be used for layer 111 which has dissimilar etch selectivity from other materials in the structure. In embodiments of the invention, the thickness of the oxide layer 1-10 nm which is roughly a half of the desired gate length for WIMPY device.

Figure 5:
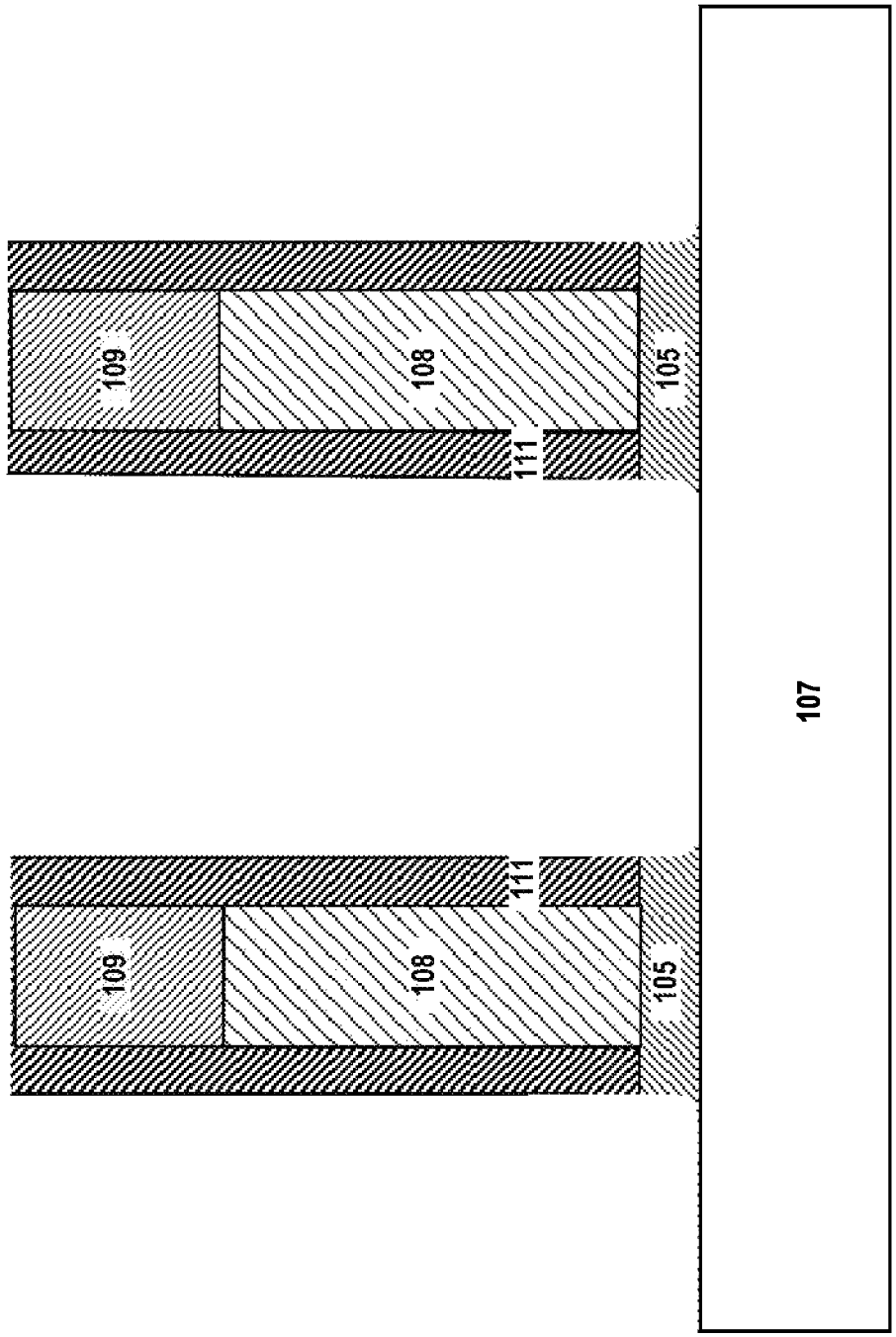
FIG. 5 is a cross-sectional diagram depicting the structure depicting the structure along a single fin depicting a cross-section of a set of sacrificial gate patterns after an oxide spacer etch step according to a first embodiment of the invention.

FIG. 5 is a cross-sectional diagram depicting the structure of the sacrificial gate patterns after an oxide spacer etch step has been performed according to a first embodiment of the invention. In this drawing, the oxide spacer etch occurs to remove the oxide layer 111 from the horizontal surfaces, leaving it on the vertical surface of the gate hard mask 109 and sacrificial gate 108. Preferred embodiments of the invention use an anisotropic reactive ion etch (RIE) process to remove the oxide. As the oxide spacer ME is not very selective to the silicon fin 107, the HiK or sacrificial SiGe layer 105 protects the fins and is removed or recessed instead of damaging the silicon fins 107.

Figure 6:
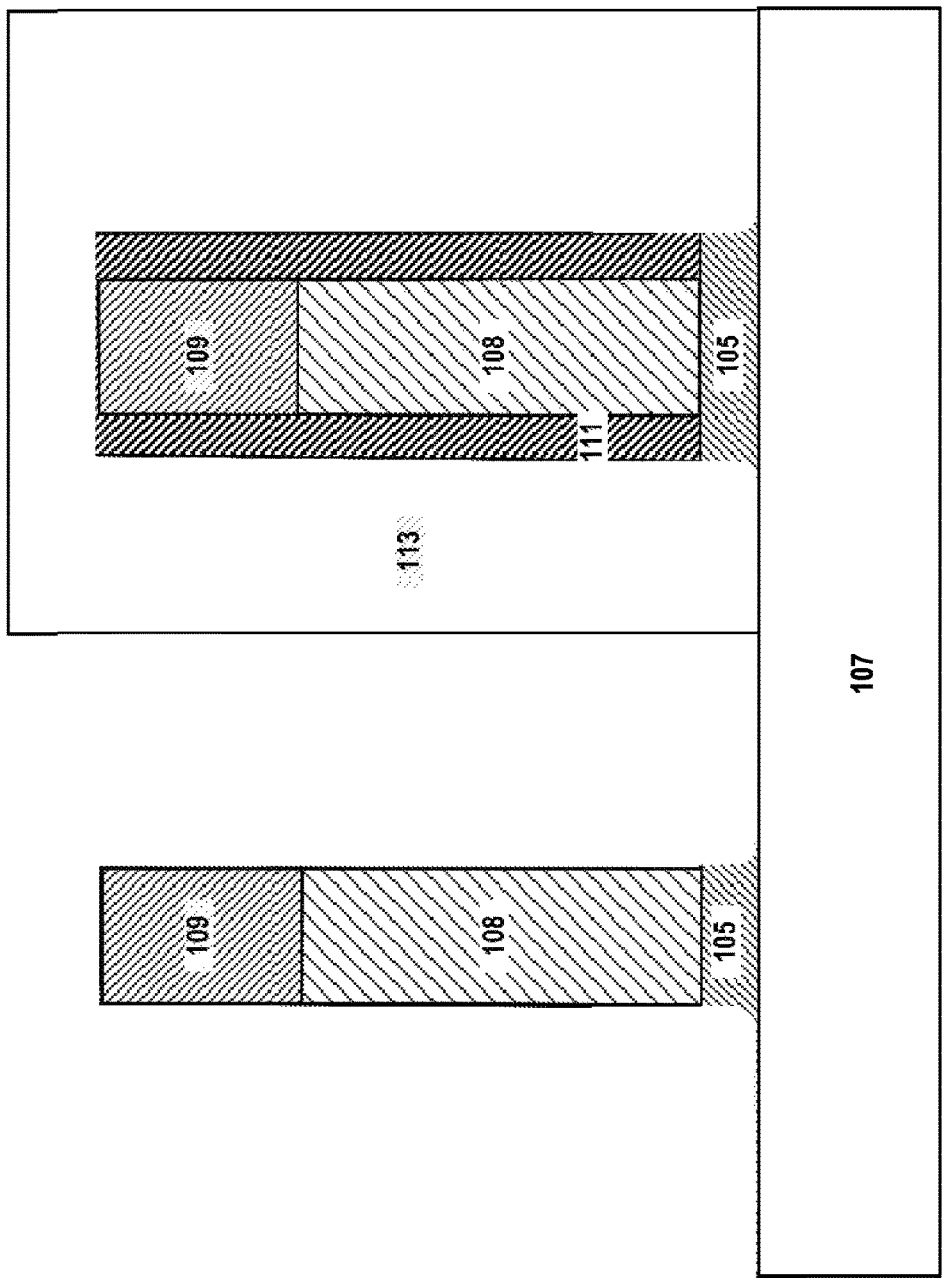
FIG. 6 is a cross-sectional diagram depicting the structure along a single fin depicting a cross-section of a set of sacrificial gate patterns after photolithography and oxide removal steps according to a first embodiment of the invention.

FIG. 6 is a cross-sectional diagram depicting the structure of the sacrificial gate patterns after photolithography and oxide removal steps according to a first embodiment of the invention. The process creates a protective photoresist mask 113 using well-known techniques over the right sacrificial gate structure, but leaves the left sacrificial gate structure unprotected. Other types of masking layers are used as protective mask 113, such as a dielectric masking layer, in alternative embodiments. Next, the oxide layer (111, not shown) on the left structure is removed using a DHF wet etch. The sacrificial hard mask 105 under 111 is laterally removed from the top of the fin 107. A dry ME or DHF lateral recess etch is preferred when a 11102 hard mask layer is used. Selective dry etching of HfO2 can be used in CF4, Cl2 and HBr Based Chemistry. When a SiGe hard mask is used, it can be removed selectively by a hot SCl wet etch or a dry HCL etch.

Figure 7:
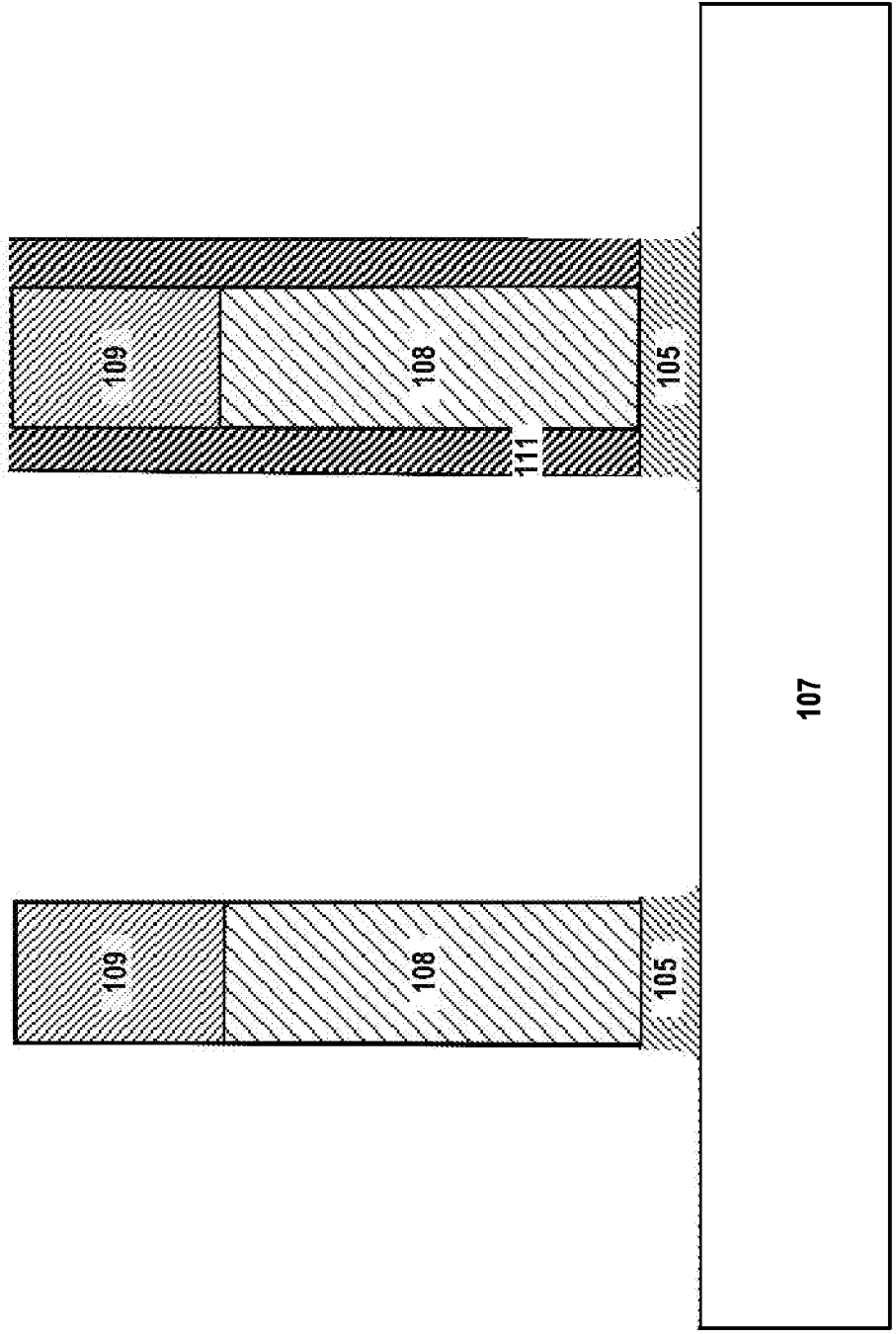
FIG. 7 is a cross-sectional diagram depicting the structure along a single fin depicting a cross-section of a set of sacrificial gate patterns after a photoresist strip step according to a first embodiment of the invention.

FIG. 7 is a cross-sectional diagram depicting the sacrificial gate patterns after a photoresist strip step according to a first embodiment of the invention. The photoresist mask is stripped by sulfuric peroxide mixture wet etch in embodiments of the invention. Alternatively, an $O_2$ ash or RIE process using $N_2O_2$ or $N_2H_2$ can be used to remove the photoresist mask. Other removal processes are used in embodiments where the protective masking layer is different material. Thus, after this step, the aggregate sacrificial gate structure on the right hand side is thicker than the aggregate sacrificial gate structure on the left hand side.

Figure 8:
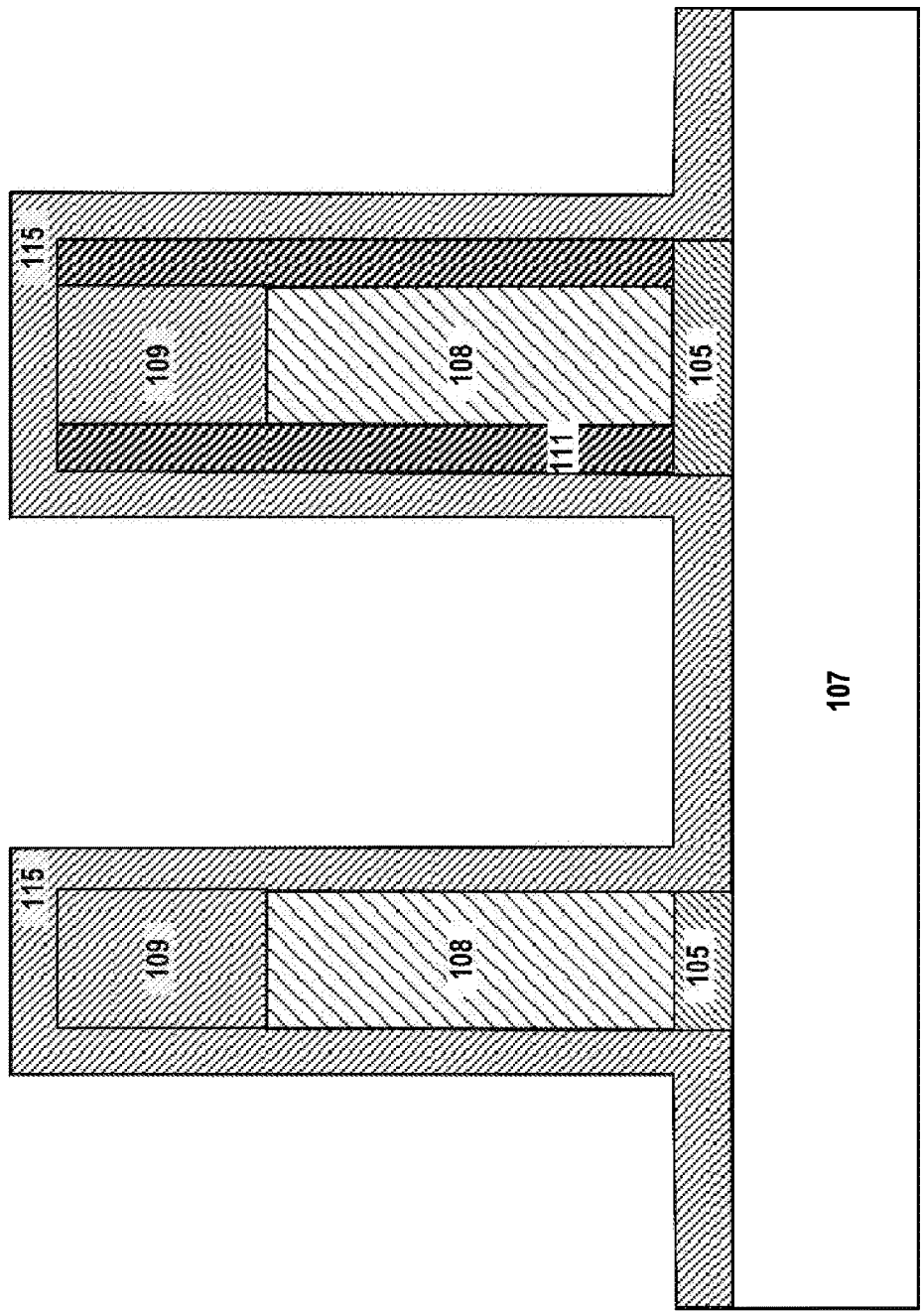
FIG. 8 is a cross-sectional diagram depicting the structure along a single fin depicting a cross-section of a set of sacrificial gate patterns after a nitride spacer deposition step according to a first embodiment of the invention.

FIG. 8 is a cross-sectional diagram depicting the sacrificial gate patterns after a nitride spacer deposition step according to a first embodiment of the invention. A deposition process, e.g., a chemical vapor process (CVD) or atomic layer deposition (ALD), produces a nitride spacer 115 over the structure. The spacer layer 115 is deposited in a conformal layer in some embodiments. The nitride layer is SiN in some preferred embodiments. In other embodiments, a Low-K nitride, e.g. but not limited to SiBCN, SiOCN can be used as the nitride spacer layer 115. In yet other embodiments, other spacer or sidewall materials are used.

Figure 9:
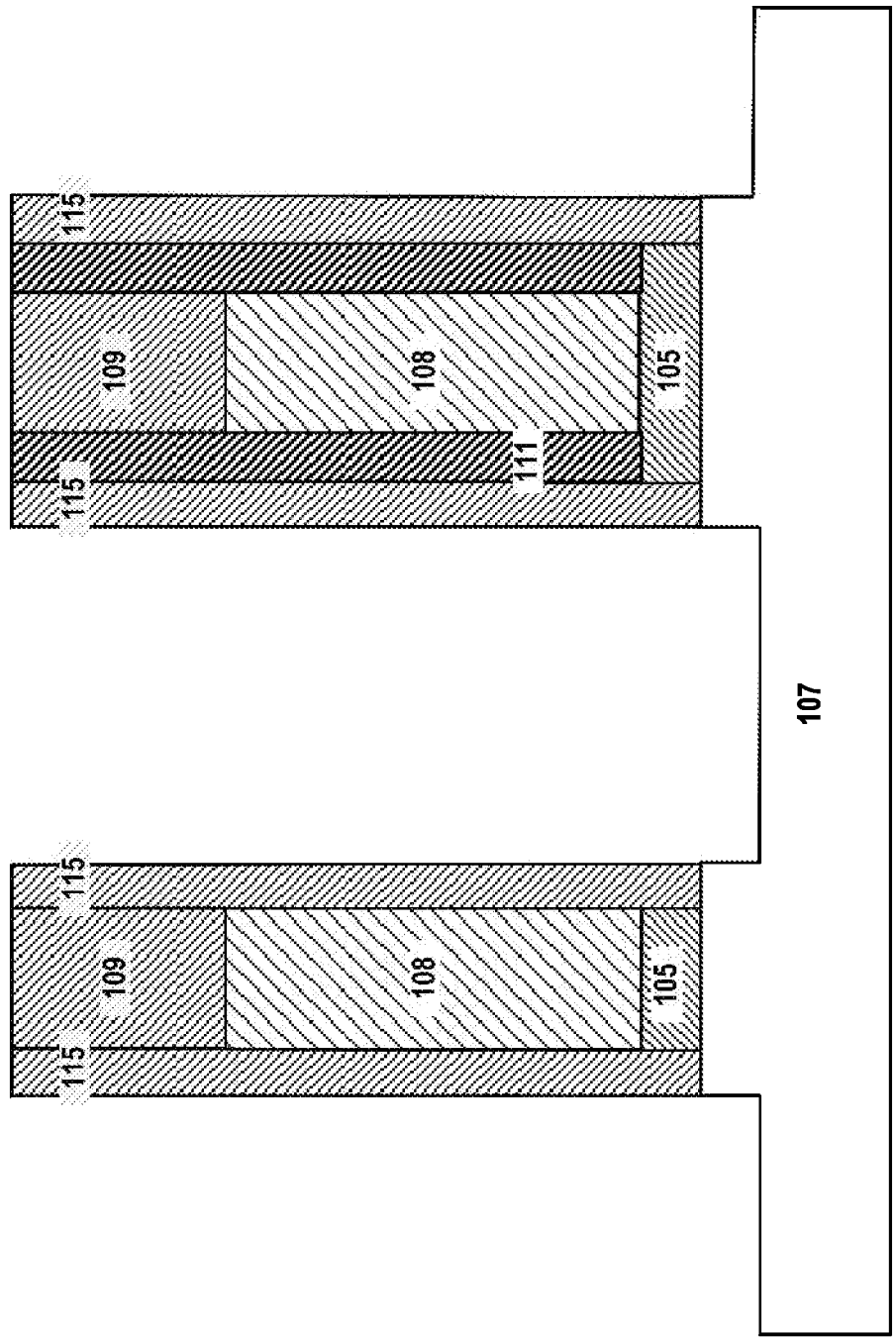
FIG. 9 is a cross-sectional diagram depicting the structure along a single fin depicting a cross-section of a set of sacrificial gate patterns after a nitride spacer etch step according to a first embodiment of the invention.

FIG. 9 is a cross-sectional diagram depicting the sacrificial gate patterns after a nitride spacer etch step according to a first embodiment of the invention. The diagram shows the structure after a sidewall etch process that removes the nitride layer 115 from the horizontal surfaces. It also depicts an optional fin recess which is used in some embodiments of the invention including the first embodiment illustrated in the drawings. An anisotropic RIE process with (but not limited to) HBr based chemistry is used in embodiments of the invention. The fin recess can be as deep as the active fin above the STI 103.

Figure 10:
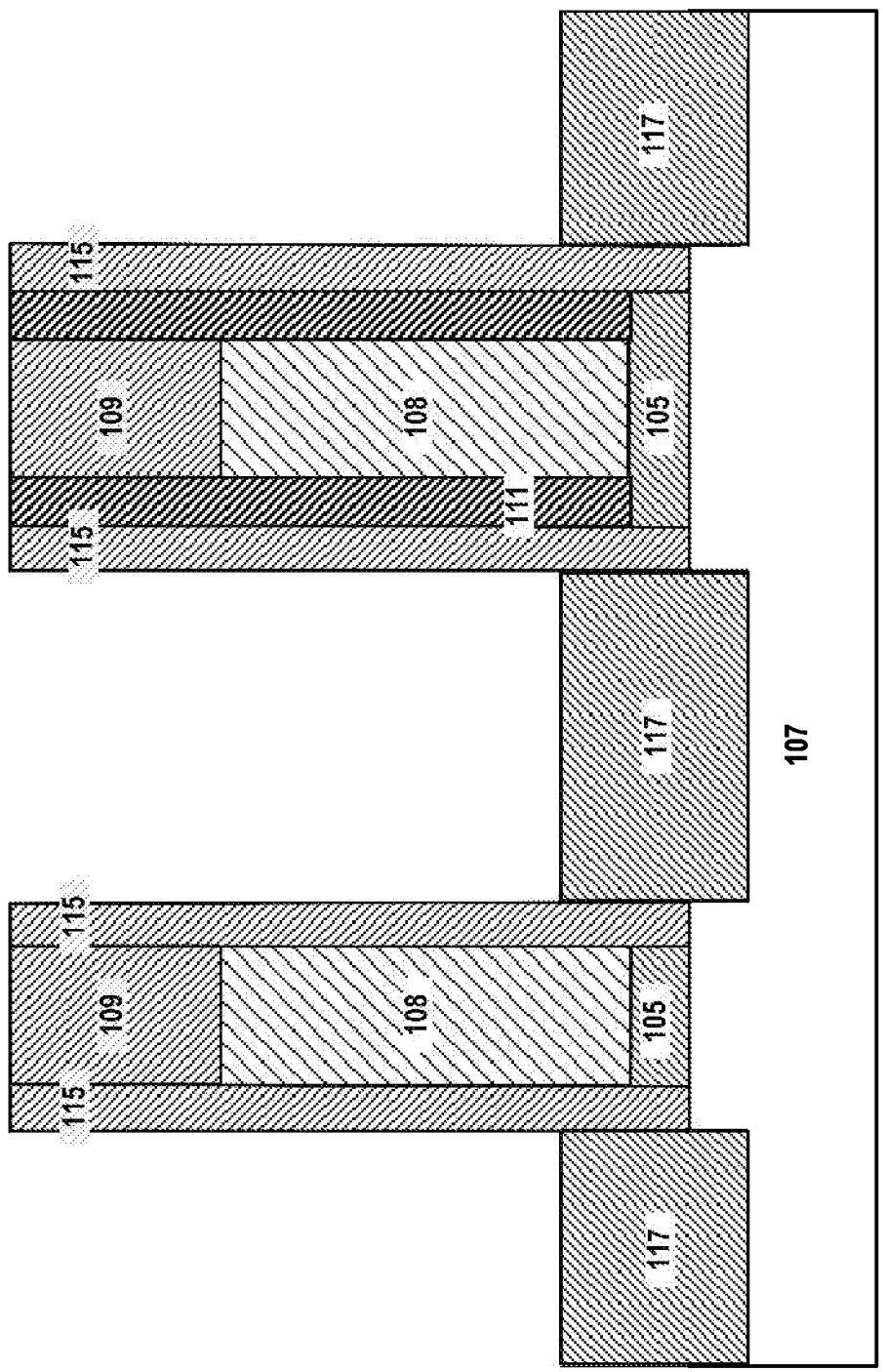
FIG. 10 is a cross-sectional diagram depicting the structure along a single fin depicting a cross-section of a set of sacrificial gate patterns after an epitaxial growth step according to a first embodiment of the invention.

FIG. 10 is a cross-sectional diagram depicting the structure for fins after one or more epitaxial growth steps are performed according to a first embodiment of the invention. In preferred embodiments of the invention, where a silicon fin is used, a CMOS epitaxial process is used to produce the epitaxial regions 117. Epitaxial growth or deposition processes cause the growth of a semiconductor material on the surface of another semiconductor material which acts as the seed for the epitaxial layer. Frequently, the epitaxial layer will be a doped layer in which a dopant is incorporated. Examples of epitaxial growth processes include rapid thermal chemical vapor deposition (RTCVD), low-energy plasma deposition (LEPD), ultra-high vacuum chemical vapor deposition (UH-VCVD) and molecular bean epitaxy (MBE).

When both pFETs and nFETs are formed, mask steps are used to limit the epitaxial growth to the appropriate fin regions. For example, if a pFET epitaxial region was first grown on the fin, the nFET region is covered with a mask to prevent epitaxial growth, e.g., a thin SiN cap. After the pFET epitaxial growth, the pFET region is blocked and the mask covering the nFET regions is opened, then the nFET epitaxial growth process is performed. In embodiments of the invention SiGe with boron is used for epitaxial growth of the pFET regions and SiP with carbon is used for the nFET regions. In alternative embodiments, the process order can change to grow the nFET epitaxial regions first and then grow the pFET epitaxial regions. Other sources can be used to create different epitaxial layers in different embodiments of the invention.

Figure 11:
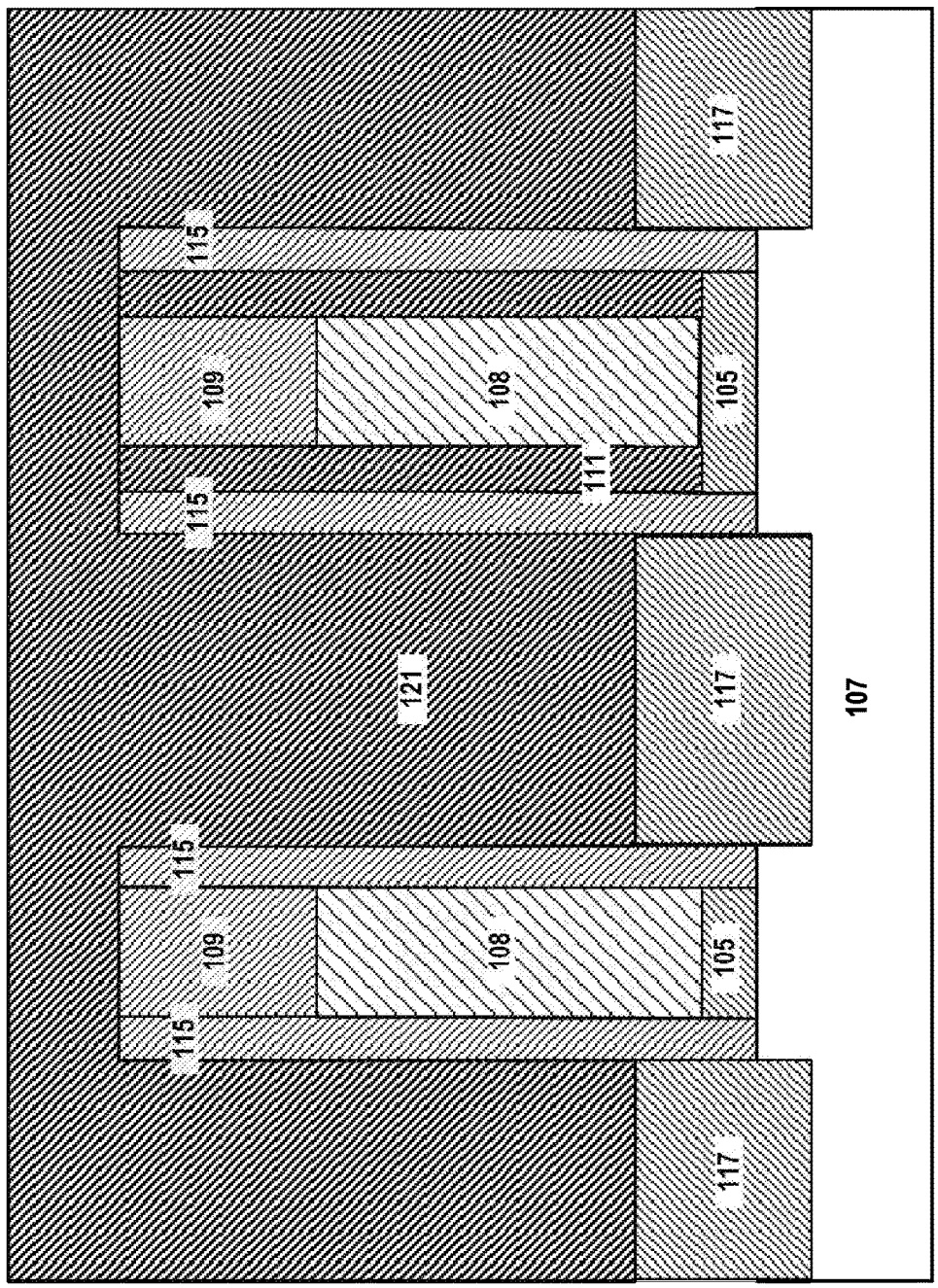
FIG. 11 is a cross-sectional diagram depicting the structure along a single fin depicting a cross-section of a set of sacrificial gate patterns after an oxide deposition step according to a first embodiment of the invention.

FIG. 11 is a cross-sectional diagram depicting the sacrificial gate patterns after an oxide deposition step according to a first embodiment of the invention. In this step, a contact dielectric layer 121 is deposited. The contact inter dielectric layer (ILD) 121 can be an oxide layer, but in alternative embodiments, other dielectrics, e.g. a low-K dielectric where K is lower than 4 can be used. The thickness of the ILD 121 can be 100-300 nm depending on total gate height including hard mask 109.

Figure 12:
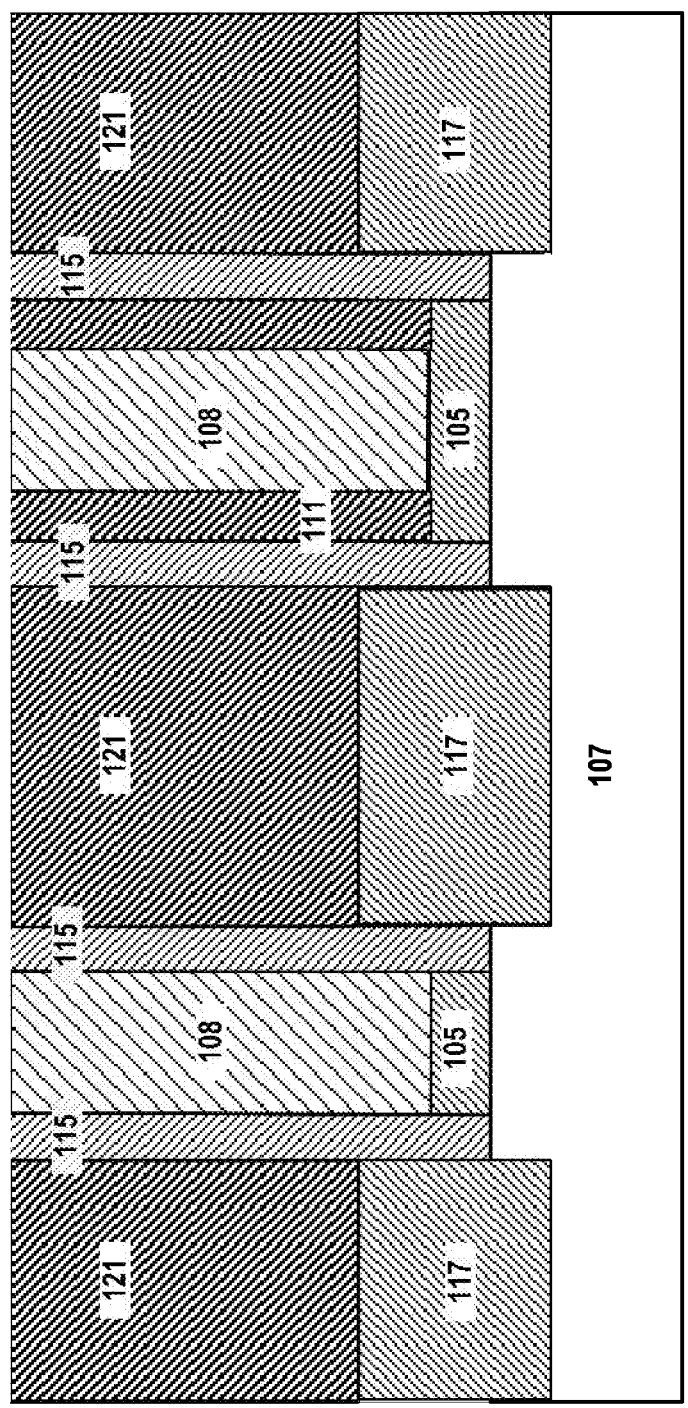
FIG. 12 is a cross-sectional diagram depicting the structure along a single fin depicting a cross-section of a set of sacrificial gate patterns after a planarization step according to a first embodiment of the invention.

FIG. 12 is a cross-sectional diagram depicting the sacrificial gate patterns after a planarization step is performed according to a first embodiment of the invention. This figure shows the structure after a chemical mechanical polishing (CMP) or other planarization process. In preferred embodiments, the CMP process uses the polysilicon gate material 108 as an etch stop. After the CMP process, the layers in the structure have a coplanar top surface. In an alternative embodiment, the removal of the ILD material 121 through polishing at the gate hard mask 109.

Figure 13:
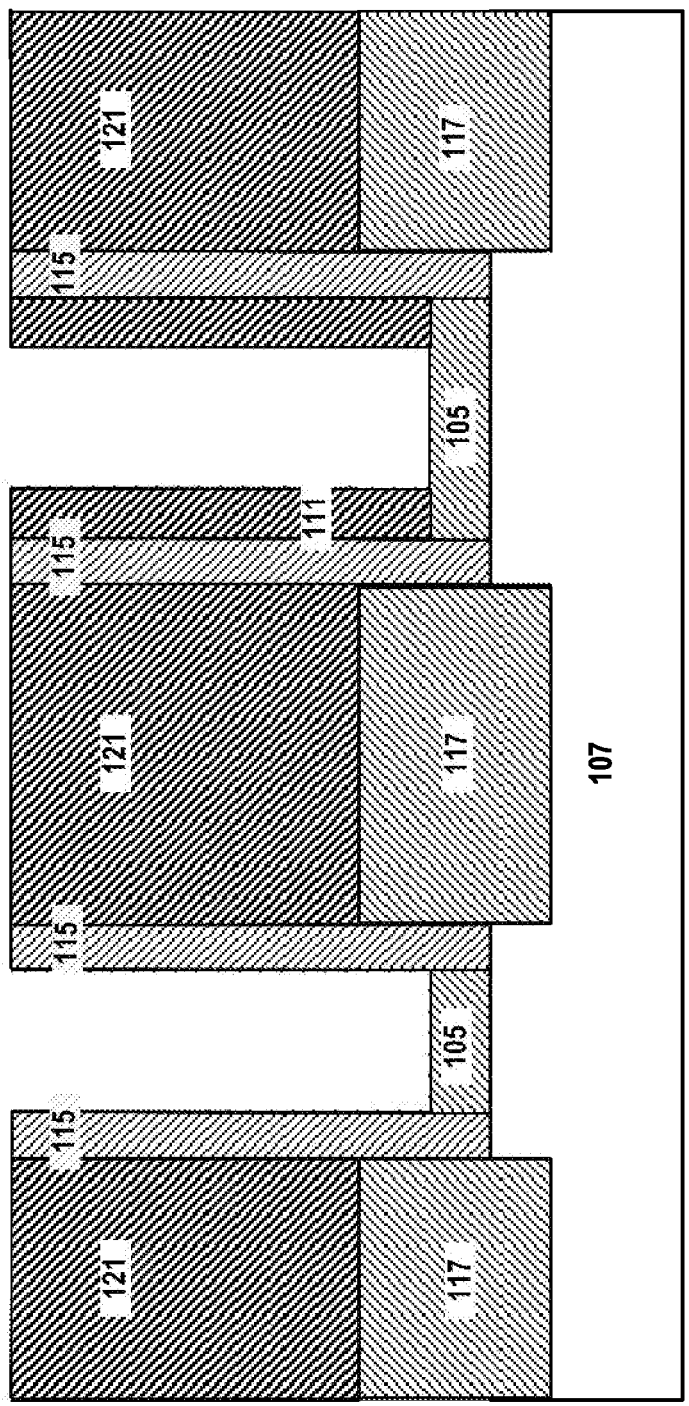
FIG. 13 is a cross-sectional diagram depicting the structure along a single fin depicting a cross-section of a set of sacrificial gate patterns after a polysilicon removal step according to a first embodiment of the invention.

FIG. 13 is a cross-sectional diagram depicting the sacrificial gate patterns after an amorphous silicon removal step using wet or dry process with best known methods according to a first embodiment of the invention. If the hard mask 109 was remaining in an alternative embodiment, hard mask removal should be performed first and then the sacrificial gate material should be removed. In this step, sacrificial gate material 108 is removed leaving the oxide spacer 111 and the nitride spacer 115 on the right hand side of the drawing, the nitride spacer 115 on the left hand of the drawing and the hard mask 105 layers at the bottom of both features.

Figure 14:
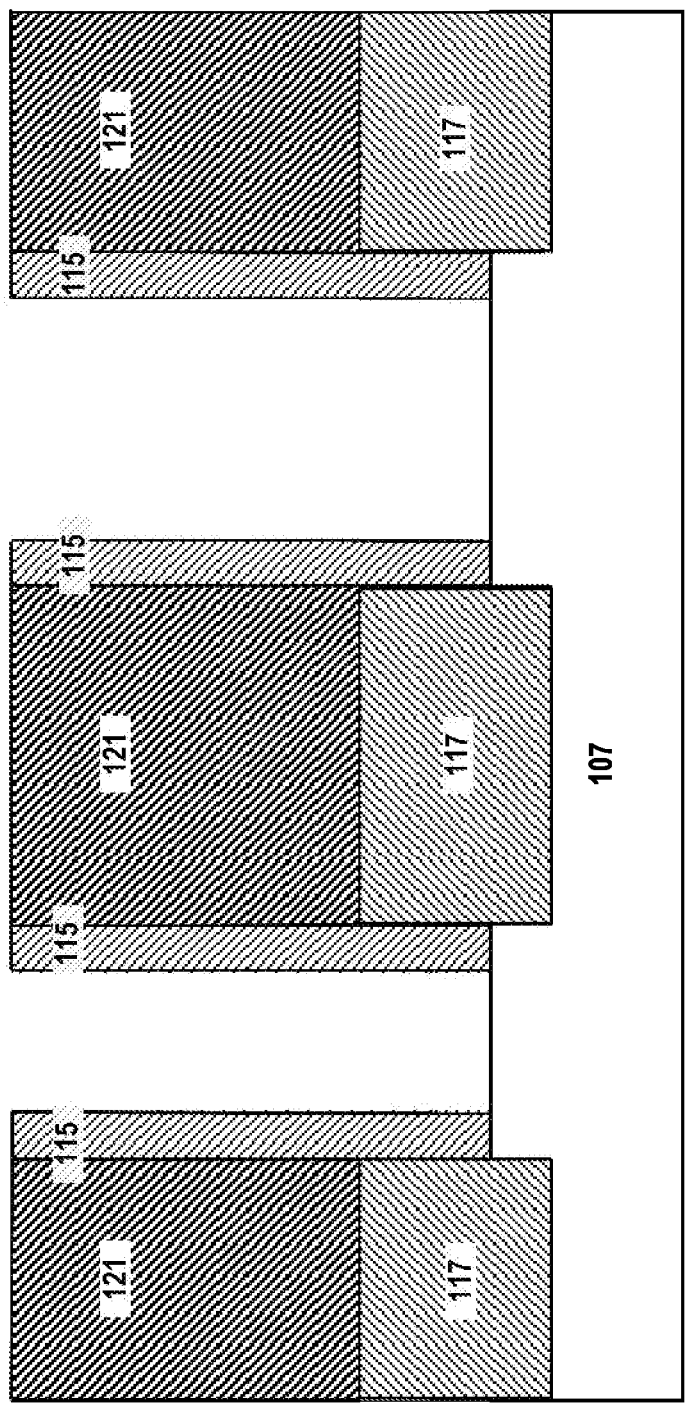
FIG. 14 is a cross-sectional diagram depicting the structure along a single fin depicting a cross-section of a set of sacrificial gate patterns after oxide spacer and SiGe removal steps according to a first embodiment of the invention.

FIG. 14 is a cross-sectional diagram depicting the structure after oxide spacer and hard mask removal steps according to a first embodiment of the invention. The oxide spacers can be removed by a HF based wet or dry etch. If the hard mask is a HiK material, removal can be accomplished by a DHF wet process or dry etching process in CF4, Cl2 and HBr based chemistry. If the hard mask is SiGe, it can be removed by a wet hot SCl etch or a dry HCl etch. Other removal processes are used in other embodiments of the invention. As the result of the removal steps, a trench recess is formed in the dielectric layer 121.

Figure 15:
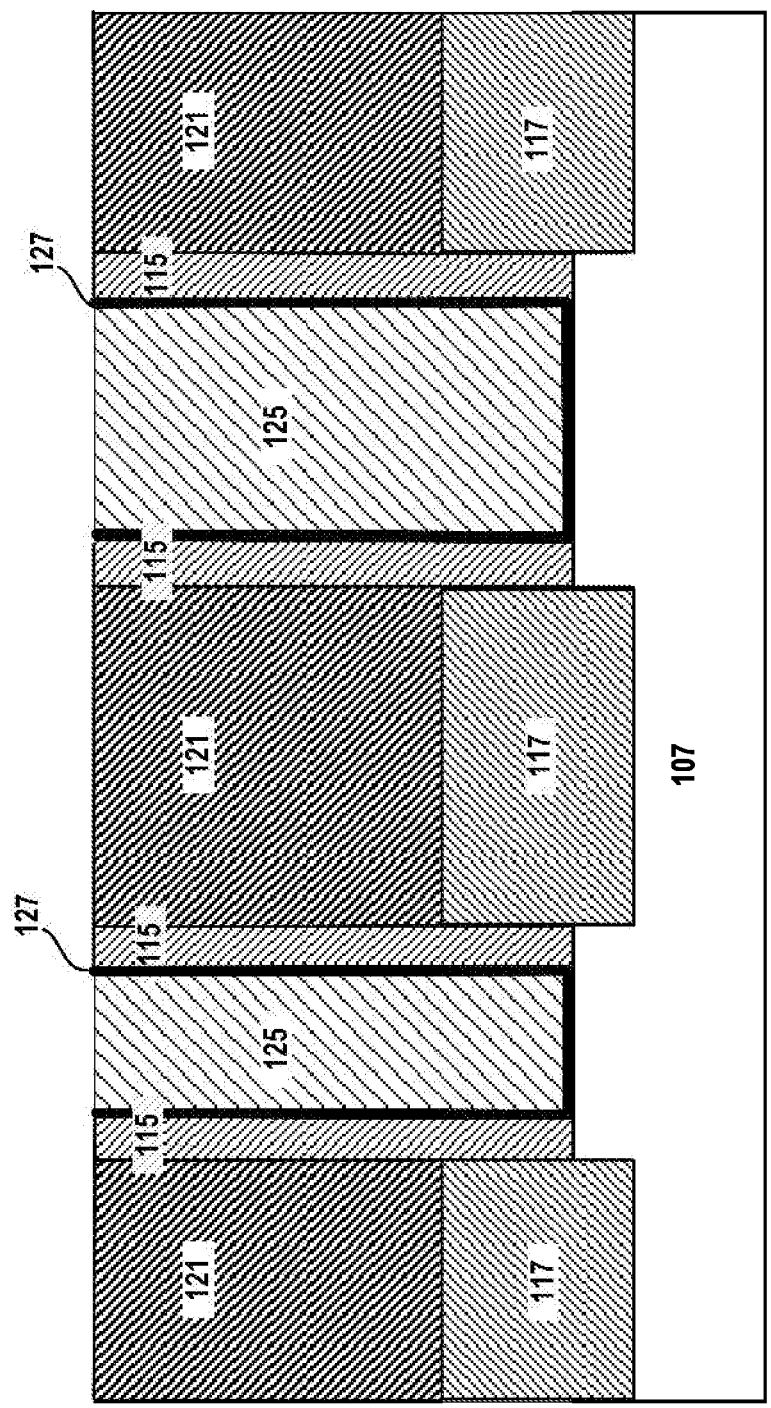
FIG. 15 is a cross-sectional diagram depicting the structure along a single fin depicting a cross-section of a set of sacrificial gate patterns after the RMG gap fill process according to a first embodiment of the invention.

FIG. 15 is a cross-sectional diagram depicting the structure after the replacement metal gap (RMG) fill process according to a first embodiment of the invention. In this drawing, the functional gates have been fabricated. In the RMG process, the trench areas are filled with a first deposit of a HiK dielectric layer 127 and then a second deposit of a work function metal (WFM) 125. Exemplary HiK layers include but are not limited to $HfO_2$, $ZrO_2$, $TiO_2$, and $Y_2O_3$. Examples of WFM layers include but are not limited to tungsten, aluminum and palladium. These layers can be deposited by a number of deposition processes including, for example, chemical vapor deposition (CVD), plasma enhanced chemical vapor deposition (PECVD), physical vapor deposition (PVD), sputtering, or atomic layer deposition (ALD). Other conductors can be used in alternative embodiments of the invention. As shown in the drawing a first permanent gate structure has been formed in the first trench recess having a first length and a second permanent gate structure has been formed in the second trench recess having a second length greater than the first length.

Figure 16:
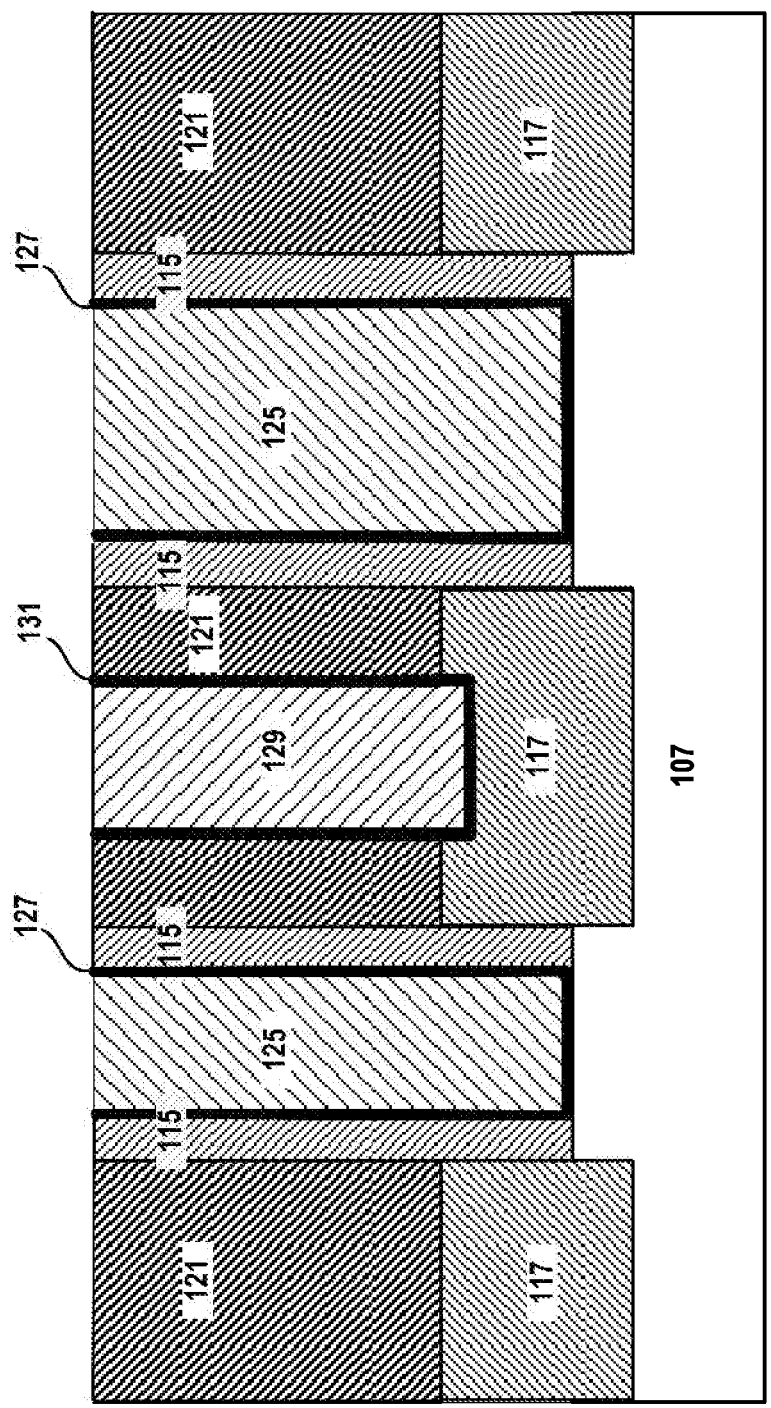
FIG. 16 is a cross-sectional diagram depicting the structure along a single fin depicting a cross-section of a set of sacrificial gate patterns after a contact formation process according to a first embodiment of the invention.

FIG. 16 is a cross-sectional diagram depicting the structure after the contact has been formed according to a first embodiment of the invention. First, a trench or via is etched through a contact dielectric layer 121 region to an epitaxial region 117. Then the feature is filled with a barrier liner 131, such as Ta, Ti, W, their nitrides or a combination of the same and a conductive metal 129, e.g., copper, aluminum, cobalt, or tungsten.

Processing of additional layers of the integrated circuit device proceeds after the steps illustrated in the disclosure. For example, a set of conductive lines could be created using an embodiment of the invention in subsequent steps if required for completion of the integrated circuit.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for Having described our invention, what we now claim is as follows:

1. A method for fabricating multiple gate width structure for an integrated circuit comprising:
   providing a fin on a semiconductor substrate, wherein the fin includes a first hard mask layer on top of the fin;
   providing a first sacrificial gate structure and a second sacrificial gate structure over the fin, wherein each of the sacrificial gate structures include a second hard mask layer on top of the sacrificial gate structures;
   forming a first spacer layer over the second sacrificial gate structure;
   forming a second spacer layer and a dielectric layer over the first and second sacrificial gate structures;
   planarizing the structure so that the first and second sacrificial gate structures and the dielectric layer have coplanar top surfaces;
   removing the first and second sacrificial gate structures and the first spacer layer over the second sacrificial gate structure to respectively form first and second trench recesses in the dielectric layer; and
   filling the trench recesses with a conductor to form permanent gate structures, wherein a first permanent gate structure formed in the first trench recess has a first length and a second permanent gate structure formed in the second trench recess has a second length greater than the first length.

2. The method as recited in claim 1, further comprising recessing the fin in areas of the fin not covered by the first and second sacrificial gate structures.

3. The method as recited in claim 1, further comprising forming epitaxial regions in areas of the fins not covered by the first and second sacrificial gate structures.

4. The method as recited in claim 3, further comprising forming a contact to an epitaxial region through the dielectric layer.

5. The method as recited in claim 1, wherein the first hard mask has a first set of etch characteristics and the second hard mask has a second set of etch characteristics.

6. The method as recited in claim 5, wherein the first hard mask is selected from the group of a high K dielectric (HiK) material and a SiGe layer and the second hard mask is selected from the group of SiN, SiN/SiO2, SiBCN and SiOCN.

7. The method as recited in claim 1, further comprising removing excess material on field areas of the dielectric layer using a planarization process.

8. The method as recited in claim 1, wherein the first spacer layer is an oxide layer and the second spacer layer is a nitride layer.

9. The method as recited in claim 8, wherein the second spacer layer is selected from the group of SiN, a Low-K nitride, SiBCN and SiOCN.

10. The method as recited in claim 3, wherein a first epitaxial region is for a pFET and formed using a SiGe and boron source and a second epitaxial region is for an nFET and formed using a SiP and carbon source.

11. The method as recited in claim 1, wherein the first sacrificial gate structure and the second sacrificial gate structure over the fin further comprise an amorphous silicon layer under the second hard mask layer.

12. The method as recited in claim 1, wherein the filling of the trench recesses comprises a first deposit of a HiK dielectric layer and a second deposit of a work function metal, wherein the HiK dielectric layer is selected from the group of $HfO_2$, $ZrO_2$, $TiO_2$, and $Y_2O_3$, and wherein the work function metal is selected from the group of tungsten, aluminum and palladium.

13. The method as recited in claim 11, wherein removing the first and second sacrificial gate structures to form trench recesses comprises an amorphous silicon removal step, an oxide spacer removal step and a first hard mask removal step.

14. The method as recited in claim 2, further comprising removing the first hard mask in areas of the fin not covered by the first and second sacrificial gate structures prior to recessing the fin in areas of the fin not covered by the first and second sacrificial gate structures.

* * * * *